(12) United States Patent
Simpson

(10) Patent No.: US 9,093,661 B2
(45) Date of Patent: *Jul. 28, 2015

(54) THIN FILM ELECTRONIC DEVICES WITH CONDUCTIVE AND TRANSPARENT GAS AND MOISTURE PERMEATION BARRIERS

(71) Applicant: Alliance for Sustainable Energy, LLC, Golden, CO (US)

(72) Inventor: Lin Jay Simpson, Lakewood, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 14/077,544

(22) Filed: Nov. 12, 2013

(65) Prior Publication Data

US 2014/0065358 A1 Mar. 6, 2014

Related U.S. Application Data

(62) Division of application No. 13/119,522, filed as application No. PCT/US2009/058176 on Sep. 24, 2009, now Pat. No. 8,609,994.

(60) Provisional application No. 61/099,814, filed on Sep. 24, 2008.

(51) Int. Cl.
*H05K 1/00* (2006.01)
*H01L 51/52* (2006.01)
(Continued)

(52) U.S. Cl.
CPC ........ *H01L 51/524* (2013.01); *H01L 31/02167* (2013.01); *H01L 31/022466* (2013.01);
(Continued)

(58) Field of Classification Search
CPC ................. H01L 31/02167; H01L 31/022466; H01L 31/048; H01L 31/1884; H01L 51/5237; H01L 51/524; H05B 33/04; Y02E 10/50
USPC .................. 174/250, 254–259, 261; 911/811; 361/760, 761; 257/59, 79, 88
See application file for complete search history.

(56) References Cited

U.S. PATENT DOCUMENTS

| 7,378,126 B2 | 5/2008 | Yamazaki |
| 7,420,210 B2 | 9/2008 | Yamazaki |

(Continued)

FOREIGN PATENT DOCUMENTS

| JP | 2002314114 | 10/2002 |
| JP | 2007101622 | 4/2007 |

OTHER PUBLICATIONS

Carcia, "Ca Test of Al2O3 Gas Diffusion Barriers Grown by Atomic Layer Deposition of Polymers", Applied Physics Letters, 89, 031915, 2006.

(Continued)

*Primary Examiner* — Yuriy Semenenko
(74) *Attorney, Agent, or Firm* — Michael A. McIntyre; W. LaNelle Owens; John C. Stolpa

(57) ABSTRACT

Thin film electronic devices (or stacks integrated with a substrate) that include a permeation barrier formed of a thin layer of metal that provides a light transmitting and electrically conductive layer, wherein the electrical conductive layer is formed on a surface of the substrate or device layer such as a transparent conducting material layer with pin holes or defects caused by manufacturing and the thin layer of metal is deposited on the conductive layer and formed from a self-healing metal that forms self-terminating oxides. A permeation plug or block is formed in or adjacent to the thin film of metal at or proximate to the pin holes to block further permeation of contaminants through the pin holes.

16 Claims, 2 Drawing Sheets

(51) Int. Cl.
  *H01L 31/0216* (2014.01)
  *H01L 31/0224* (2006.01)
  *H01L 31/048* (2014.01)
  *H01L 31/18* (2006.01)
  *H05B 33/04* (2006.01)

(52) U.S. Cl.
  CPC .......... *H01L31/048* (2013.01); *H01L 31/1884* (2013.01); *H05B 33/04* (2013.01); *H01L 51/5237* (2013.01); *Y02E 10/50* (2013.01); *Y10T 428/24331* (2015.01); *Y10T 428/265* (2015.01)

(56) References Cited

U.S. PATENT DOCUMENTS

| | | | |
|---|---|---|---|
| 8,609,994 B2 * | 12/2013 | Simpson | 174/258 |
| 2002/0180924 A1 * | 12/2002 | Sobrinho | 349/158 |
| 2003/0041894 A1 | 3/2003 | Sverdrup, Jr. | |
| 2004/0021820 A1 * | 2/2004 | Sobrinho | 349/158 |
| 2004/0113220 A1 * | 6/2004 | Rieve et al. | 257/432 |
| 2004/0195572 A1 * | 10/2004 | Kato et al. | 257/72 |
| 2004/0211458 A1 | 10/2004 | Gui | |
| 2005/0051763 A1 | 3/2005 | Affinito et al. | |
| 2005/0109392 A1 | 5/2005 | Hollars | |
| 2006/0097650 A1 | 5/2006 | Kim | |
| 2006/0223214 A1 | 10/2006 | Rieve et al. | |
| 2007/0141393 A1 | 6/2007 | Klubek | |
| 2007/0181912 A1 | 8/2007 | Ikeda | |
| 2008/0038529 A1 | 2/2008 | Nakayama | |
| 2008/0100202 A1 | 5/2008 | Cok | |
| 2008/0272367 A1 * | 11/2008 | Cok | 257/40 |
| 2009/0124062 A1 * | 5/2009 | Yamazaki et al. | 438/457 |
| 2011/0074282 A1 * | 3/2011 | Bright | 313/504 |
| 2011/0168436 A1 | 7/2011 | Simpson | |

OTHER PUBLICATIONS

Lewis, "Highly Flexible Transparent Electrodes for Organic Light-Emitting Diode-Based Displays", Applied Physics Letters, vol. 85, No. 16, pp. 3450-3452, 2004.

Sahu, "High Quality Transparent Conductive ZnO/Ag/ZnO Multilayer Films Deposited at Room Temperature", Thin Solid Films, 515, pp. 876-879, 2006.

International Preliminary Report on Patentability and Written Opinion of the International Searching Authority, dated May 31, 2010, for International Application No. PCT/US09/058176.

International Search Report, dated May 31, 2010, for International Application No. PCT/US09/058176.

* cited by examiner

THIN FILM ELECTRONIC DEVICES WITH CONDUCTIVE AND TRANSPARENT GAS AND MOISTURE PERMEATION BARRIERS

CROSS-REFERENCE TO RELATED APPLICATIONS

This application claims the benefit of U.S. Provisional Application No. 61/099,814 filed Sep. 24, 2008, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Materials that are electrical conductors and are also relatively transparent (or highly transmissive of light) are extensively used in electronics applications and in a wide variety of electronic devices. Such materials may be labeled transparent conducting (TC) materials and are often provided in a multi-layered device or substrate using thin film technologies. For example, one of the most widely used commercial TC materials is indium-tin oxide (ITO), which may be applied as a thin film or layer (e.g., a layer of material that has a thickness less than about 1 micron) to a supporting substrate of glass, ceramic, plastic, or other light transmitting material. TC materials are used in solar or photovoltaic cells and in many other electronic devices such as in touch screens and the like. TC materials are also widely used in organic electronics applications including organic light emitting diodes (OLEDs) in which the emissive electroluminescent layer is composed of a film of organic compounds.

To function properly, the TC materials or substrates containing thin films of such materials typically have desired levels of transparency and electric conductivity. Additionally, it is often desirable that the TC substrates be flexible or otherwise resist cracking. Further, many applications such as OLED devices should be protected from moisture and gases as the functionality of a TC material layer may be ruined or degraded by water or exposure to oxygen and other gases. For example, a photovoltaic cell may be exposed to flexing and bending due to wind and other forces and may also be exposed to moisture and other environmental elements that can degrade effectiveness of the cell. Hence, there have been significant efforts to provide thin film devices or substrates with TC material layers that meet transparency and conductivity while including separate permeation bathers and satisfying other demands such as lower costs and ease of manufacture.

Providing a TC material with high conductivity and transparency has proven challenging to thin film device developers. In general, conductivity and transparency are inversely related in most common forms of transparent conductors such as transparent conducting oxides or TCOs, and, as a result, a material with higher conductivity may have lower transparency and vice versa. ITO has been widely used as the transparent conductor in electronic devices because it provides a balance between transparency and conductivity. However, indium is relatively expensive as it is typically produced as a byproduct of zinc mining and it is a rare metal. Less expensive alternatives such as doped zinc oxide (ZnO) and other TC materials have been used in some devices as the transparent conductor but process sensitivities and lower conductivity/transparency performance issues have limited the commercial acceptance of these substitutes for ITO. Attempts to lower the costs associated with use of ITO and other TC materials have included using less material, i.e., depositing a thinner TC layer. However, the use of thinner layers of the TC material when combined with repeated bending and other stresses often results in cracks in the brittle TC material, and these cracks often unacceptably increase resistivity (i.e., lower conductivity) of the TC layer.

In some efforts to overcome existing limitations of the TC materials, thin film device developers have used films of a metal such as silver, gold, or copper in conjunction with the TCO. The film of metal is provided to enhance the conductivity of the TCO layer while attempting to maintain a desired level of transparency. In such devices, the substrate can be designed to have a metal layer and a TCO layer that provides a higher light transmission than the metal layer or film by itself and also higher conductivity than the TCO material by itself. As a result, these devices may use thinner TC layers (i.e., use less TCO material) while providing the same or enhanced conductivity and/or light transmission. These devices have not been widely adopted commercially in part because these devices often have to be relatively thick. Specifically, the deposition of metals such as silver may involve islanding problems that make it difficult to apply a thin film of the highly conductive metal. Additionally, a non-conformal coating of such metal has decreased conductivity. Hence, these devices typically have a metal layer applied over the transparent conductor that is 7 to 10 nanometers (nm) or more thick to achieve desired conductivity.

In addition to providing transparency and conductivity, many electronic devices such as photovoltaic devices and devices with OLEDs must be protected from environmental contaminants such as moisture and air. A substantial cost of many thin film electronic devices is associated with incorporating a barrier or coating to try to prevent oxygen, water, and/or other environmental contaminants from reaching sensitive electronic components such as the TC layer. While relatively thick metal coatings are used to provide such protection in some packaging, these layers are not transparent which makes them unacceptable for many applications such as solar cells, and the permeation barrier may still not be adequate for the particular device. Particularly, some applications (e.g., organic-based electronic devices such as OLEDs for displays or organic photovoltaics) may use permeation rates for water/oxygen less than about $10^{-6}$ grams/$m^2$-day. As a point of comparison, typical permeation rates of water through 4-mil PET is about 10 grams/$m^2$-day at standard test conditions of 40° C. and 40 percent relative humidity. Layers of inorganic coatings such as oxides and nitrides (e.g., aluminum oxide, silicon oxide, and silicon nitride) are often used in conjunction with a plastic substrate to reduce the permeation by a factor of 10 to 1000. Permeation drops as the inorganic thickness increases, but it reaches a lower limit for film thicknesses of a few hundred to about 2 thousand Angstroms.

The lower limit for permeation is associated with the inevitable presence of film defects such as pinholes, cracks, scratches, and the like. This has been found to be true for a wide range of materials and deposition techniques such as physical vapor deposition by evaporation or sputtering and for plasma enhanced chemical vapor deposition. In an attempt to disconnect the pinholes and cracks, layers of organic materials have been incorporated in some devices, but research indicates that due to the relatively thick geometry of these layers the water/oxygen transport was simply delayed and not blocked (i.e., the overall permeation rate is not substantially reduced). Hence, the diffusion rate through these multiple layer configurations is approximately the same as through a single inorganic layer of sufficient thickness. Another permeation barrier technique has attempted to address the problem with pinholes by constructing a conformal pinhole-free inorganic oxide coating using atomic layer deposition (ALD) to apply the barrier layer, and, in tests, these barriers achieve significant improvements in the permeation rate of water/oxygen. Unfortunately, the use of oxides and similar materials is not acceptable in many settings where high conductivity is desired as these materials have high resistivity. Additionally, oxide layers are often brittle and may often crack when stresses are applied or may propagate cracks that form in the underlying layers.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Briefly, the following discussion describes thin film electronic devices and substrates for such devices that are adapted to provide very low permeation rates of moisture and/or gas (e.g., less than about $10^{-6}$ grams/m$^2$-day). To this end, the thin film devices include a thin transparent and conductive layer of metal such as a layer of metal deposited or applied to a transparent conductor or other transparent material. The metal layer functions as an effective water vapor barrier, e.g., a barrier that may improve/decrease the water vapor transport rate by up to 3 orders of magnitude or more. The metal layer in some embodiments is less than about 5 nm thick and, more preferably, less than about 3 nm. In some cases, the metal layer is even more preferably less than about 1 nm, e.g., about 0.5 to about 1 rim or the like. In some embodiments, the metal is chosen to be a "self-healing" and/or "self-terminating" oxide layer metal such as a thin layer of aluminum, chromium, titanium, or the like that reacts with water, oxygen, or the like that may be passed through a pinhole, crack, or other passageway. The reaction forms a plug or a dam that blocks further corrosion/oxidation and further permeation of the environmental contaminant, which is important as pin holes or other defects often control transmission rates of water or other contaminants through many thin film devices.

The permeation barrier techniques described herein go beyond the previous state-of-the-art transparent conductor and barrier technologies by providing a conformal metal coating (e.g., a thin film of aluminum, silver, or the like possibly in conjunction with inorganic coatings such as alumina) to create a light transmitting, conducting thin film stack. In this stack, the thin conformal metal coating (or permeation barrier) provides: (a) a substantially higher electrical conductivity when compared to other barriers; (b) a bather to environmental contamination propagation even along pinholes, cracks, and other passageways; (c) a crack propagation inhibitor due to the flexibility of the layer's material that substantially increases fracture toughness of the stack/device; and (d) when a non-noble metal such as aluminum is used, a self-healing film that forms an oxide permeation barrier (or passageway plug) at the location where water, oxygen, or other contaminant is attempting to propagate through the thin film device layers.

More particularly, a thin film stack is provided for use in electronic devices such as photovoltaic devices, OLEDs, and the like. The thin film stack may be integrated with a substrate such as a light transmitting/transmissive layer of glass, ceramic, or plastic. An electrical conductor layer is formed on (e.g., deposited upon) a surface of the substrate or device. This layer may be a thin film of a transparent conducting (TC) material such as ITO or the like, and the fabrication of this layer may produce a plurality of pin holes or defects in the layer. The thin film stack also includes a thin film of a metal that acts as a permeation barrier for environmental contaminants. The thin film of metal is deposited or provided on the conductor layer and is formed from a metal that is self-healing, e.g., is chosen from the group of metals that form self-terminating oxides when exposed to oxygen (e.g., water, air, or the like). In this manner, a permeation plug or block is formed in or adjacent to the thin film of metal at or proximate to the pin holes to block further permeation of contaminants through the pin holes of the conductor layer. For example, the metal of the permeation barrier layer may be a non-noble metal such as aluminum, chromium, titanium, or the like, and the barrier layer may be relatively thin such as less than about 10 nm in thickness (e.g., between about 0.5 and about 3 nm).

The thin film stack may further include an additional electrical conductor layer, with the thin film of metal or the permeation barrier being interposed or sandwiched between the conductor layers (e.g., layers of TC material such as ITO or the like). The stack may also include a high conductivity layer between the two conductors and abutting the thin film of metal of the barrier layer, with the high conductivity layer being formed of a metal that is more conductive than the barrier layer's metal (e.g., the barrier layer may be formed of aluminum and the conductivity layer may be silver, gold, or copper). The stack may also include a permeation barrier formed of a layer of an inorganic oxide (such as alumina) interposed with the thin film of metal of the bather and the conductor layers, which provides a conformal layer of material to fill or plug the pin holes and lower the water vapor transport rate of the stack.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

The following provides a description of thin film electronic devices or stacks that include a permeation barrier formed of thin layer of metal that provides a light transmitting and electrically conductive layer. The permeation barrier may be used in a wide variety of devices such as those in which permeation rates are very low such as less than about $10^{-6}$ grams/m$^2$-day, and these devices may include photovoltaic devices, OLEDs and devices with OLEDs, and any other device in which a permeation barrier is useful to protect another thin layer such as a transparent conductor or the like.

Figure 1:
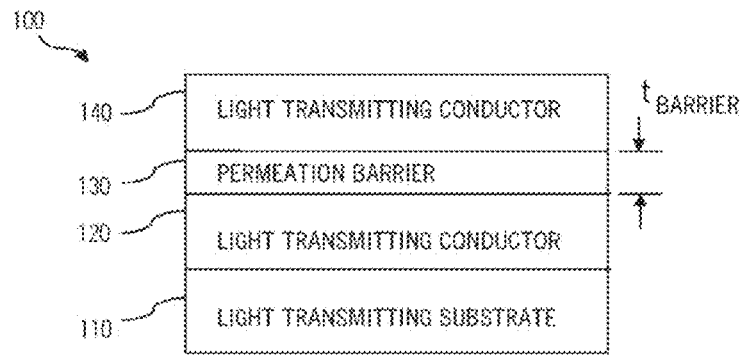
FIG. 1 illustrates schematically a thin film electronic device (or multi-layer substrate for such a device) that includes a moisture/gas permeation barrier covering a light transmitting or "transparent" conductor.

FIG. 1 illustrates an exemplary thin film device 100 (e.g., an OLED, solar cell, or the like) or portion/stack of such device. As shown, the device 100 includes a light transmitting (or generally transparent) substrate 110 such as a layer of glass, ceramic, or plastic that allows light to pass and provides structural support for the device 100. The device 100 further includes a light transmitting conductor 120 that is applied on the substrate 110 such as by a deposition technique used for applying a thin film The light transmitting conductor 120 may comprise a thin film of a material such as ITO or other material selected to provide desired levels of transparency and conductance. The device 100 also includes a second light transmitting conductor 140, and during operation, the conductors 120, 140 may act as electrical contacts, anodes, cathodes, counter electrodes, and the like to provide desired photovoltaic, LED, and other operations of the device 100.

Significantly, the device 100 includes a permeation barrier 130 interposed between the conductor layers 120, 140. The permeation barrier 130 is formed of a thin layer of metal (or metallic compound or alloy) such as a metal deposited using physical vapor deposition, chemical vapor deposition, plating, or other technique to apply a thin film of material on the upper or exposed surface of the light transmitting conductor 120. The permeation barrier (or permeation barrier layer) 130 is formed of a metal such as aluminum, chromium, silver, gold, or the like, and, since it is being provided as a permeation barrier rather than as a high conductivity layer, it may be relatively thin such as with a thickness, $t_{Barrier}$, of less than about 10 nm or preferably less than about 3 nm such as less than about 0.5 nm to about 1 nm In some embodiments, the metal of barrier 130 is chosen for its self-terminating characteristics and may be aluminum, chromium, or another non-noble metal (or a combination of such metals) that forms an oxide when exposed to water, oxygen, and the like. The formation of the oxide is useful for forming an oxide plug or block to limit further permeation of the environmental contaminant such as at the outlet of a pinhole or crack. In such cases, the metal of bather 130 may be chosen to have adequate light transmission and conductance characteristics but have less conductance/transmission than other metals (e.g., aluminum may be chosen for its relatively good conductivity and transparency while other metals such as silver are more conductive).

The permeation barrier 130 may be considered a very thin conductive, conformal metal coating that functions in the device or stack 100 to substantially reduce resistance (e.g., less than 10 ohms/sq or the like) and also provide a self-healing permeation barrier to environmental contaminants like water and oxygen. In one fabrication method, the thin metal film of barrier 130 is formed using a technique such as atomic layer or electrochemical deposition so as to provide a conformal, thin (e.g., less than about 10 nm thick), pin-hole-free film. In use, the barrier 130 also functions to pin cracks that may occur when adjacent or other layers such as the conductors 120, 140 are formed of ceramic TCOs, thereby increasing durability and flexibility of the device 100. Also, in some applications, the thicknesses of the transmitting conductors 120, 140 may be reduced and/or different materials used while still providing desired functionality of the device (e.g., levels of transparency, conductivity, and so on) with an order of magnitude reduction in material costs.

In other embodiments, the metal used to form barrier 130 may be chosen specifically for its high conductivity characteristics such as silver, gold, copper, and the like, but even in these cases, the thickness, $t_{Barrier}$, may be relatively low to achieve desired permeation barrier qualities (rather than desired conductivity). For example, a silver permeation barrier 130 may be useful in the device 100 and may have a thickness, $t_{Barrier}$, of less than about 5 nm while some embodiments may utilize a thickness, $t_{Barrier}$, of less than 3 nm (e.g., between about 0.5 and about 3 nm or the like).

Figure 2:
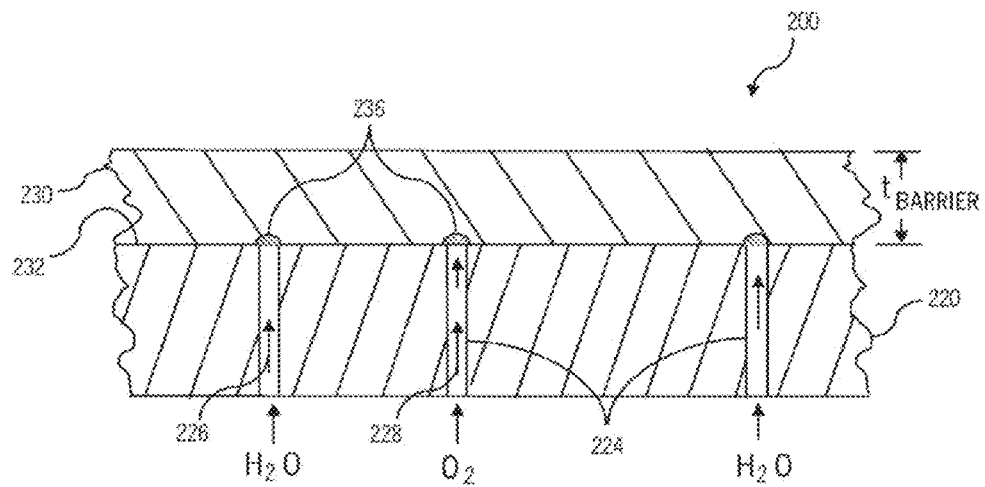
FIG. 2 illustrates a partial sectional view of a thin film electronic device in which a self-healing permeation barrier has functioned to plug pinholes or passageways in a layer of the device (e.g., a conductor, a TC material layer, or the like).

FIG. 2 illustrates another thin film electronic device or substrate 200 such as it may appear after a period of use or exposure to environmental contaminants. As shown, the device 200 includes a transparent conductor (TC) material layer 220, e.g., a layer of ITO or the like that transmits light and also conducts electricity. The layer 220 may be formed using deposition or other techniques that may (unintentionally) allow pinholes (or small passageways) 224 to form providing a path for contaminants 226 such as water, oxygen/air, and the like to pass through the layer 220. The device 200 also includes a permeation barrier 230 that abuts a surface of the layer 220 at interface/junction 232.

The barrier 230 typically is formed of a metal that has a thickness, $t_{Barrier}$, that is less than about 10 nm and more typically less than 5 nm (such as greater than about 0.5 nm but less than about 3 mu). The metal of barrier 230 of device 200 is chosen to be a non-noble or self-terminating oxide metal that forms an oxide plug/permeation inhibitor 236 when exposed to water or oxygen 226, 228 at or proximate to the interface/junction 232. In this manner, the barrier 230 is a self-healing and/or self-terminating in that an oxide metal barrier is formed that prevents further oxidation and further permeation of the contaminant 226, 228 and also acts to plug/heal the pinholes (or other passageways such as cracks) 224 in the TC material layer 220. To this end, the metal of layer 230 may be aluminum, chromium, or other similar metal that forms an oxide when exposed to water or oxygen 226, 228 with the particular metal being chosen to suit or balance the desires for light transmission and electrical conductivity of the device 200.

The devices 100 and 200 provide thin film devices/stacks with a light transmitting conducting permeation barrier 120, 220. The barriers 120, 220 (or devices 100, 200 with such barriers) may be described as providing the following: (a) enhanced transmission and electrical conductivity using thinner layers than typically desired in TCOs alone; (b) an enhanced permeation barrier to water, oxygen, and other environmental contaminants; (c) enhanced fracture toughness from single or cyclic loading due to the addition of the flexible thin metal layer that improves bendability and electrical conductivity of the devices 100, 200; and/or (d) self-healing capabilities that result in formation of improved permeation barriers or plugs at the points where contaminants are propagating through the lattice or stack either from existing or newly-formed defects/pinholes.

According to the embodiments described herein, the thin film coatings or barriers include materials that provide an enhanced barrier to permeation of environmental contaminants and may also have electrical conductivity and be transmissive to light at desired frequencies for the device. The thin film coatings or barriers may also include layers that are conformal and free of pin holes while also being electrically conductive and transmissive to the frequencies of light desired. The specific components included in a particular thin film electronic device or stack may be varied in practice and may include a variety of materials and configurations that enable a desired level of light transmission, electrical conductivity, permeation rates, and fracture toughness.

One difference between the permeation barrier described and prior permeation barriers is that the described permeation barrier enables order of magnitude improvements in the permeation barrier. In other words, the rate of permeation is reduced by orders of magnitude without further devices or by use of the barrier itself. In some embodiments, the permeation barrier taught herein provides the added benefit of being self-healing. A further advantage is that use of the permeation barriers provides the ability to use substantially thinner films to achieve light transmission and electrical conductivity in a thin film electronic device. Thus, unlike permeation barriers that rely on conformal coatings of inorganic oxides, the conformal metal coating (or permeation barrier layer) of embodiments of devices described herein provides a superior permeation barrier as well as high electrical conductivity.

There is no specific limit to the materials and configurations that may be used to form the permeation barriers and/or the light transmitting conducting layers of embodiments of thin film devices. In some cases, though, it may be preferable that materials and configurations be used that provide satisfactory or desirable performance for a given set of operating conditions and/or design parameters for a particular device. The following description provides a few more specific examples of use of a permeation barrier to provide an improved thin film electronic device, but these only represent a sampling of the many possible configurations that may be used to construct devices with useful coatings or barriers.

In one exemplary embodiment, a device (such as device 200 shown in FIG. 2) may be formed by depositing a thin film coating of light transmitting material on a device substrate. This light transmitting material may be a metal oxide, a metal or metal compound, and/or a light transmitting and electric conducting material. Upon this layer of light transmitting material, a permeation barrier of a metal or a metal compound is deposited or applied. If a single coating is used, then it may be a conformal coating of metal (such as may be provided using a technique such as ALD, electrochemistry, or the like). The barrier may be very thin such as about 5 to about 50 Angstroms or more to attain the typical light transmission desired for commercial applications/devices. The thin conformal metal coating provides more than an order of magnitude improvement in barrier permeability while also providing desirable levels of light transmission and electrical conductivity.

Figure 3:
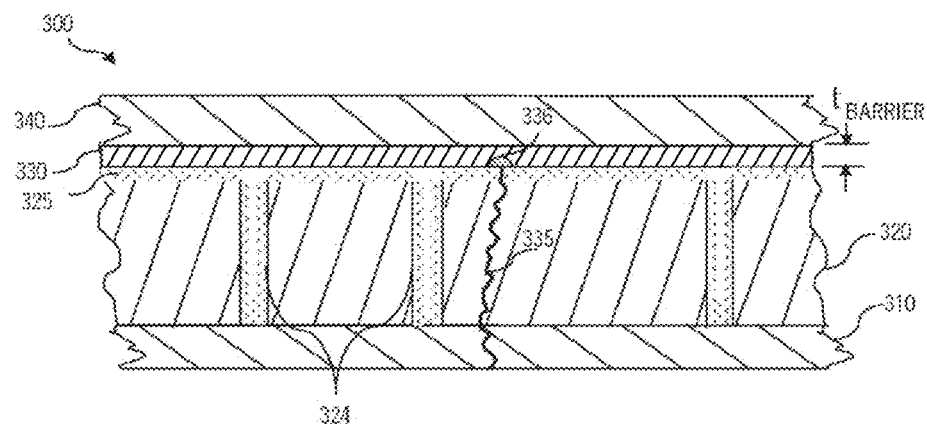
FIG. 3 illustrates a partial sectional view of a thin film electronic device in which a conductive and transparent permeation bather is used in conjunction with another permeation barrier (e.g., an oxide layer used to plug pin holes).

To improve barrier permeability (e.g., lower permeation rates further), a device 300 as shown in FIG. 3 may be provided that includes a thin film metal layer or permeation barrier 330 that is used in conjunction with a standard and/or conformal light transmitting coating like a metal oxide coating 325 (shown conformal in the device 300). As shown, the device 300 includes a substrate 310 (e.g., a light transmitting layer of glass, ceramic, or plastic) upon which a light transmitting material 320 has been applied or deposited (e.g., an inorganic oxide, organic, TCO or similar material layer). An oxide permeation barrier 325 may be applied over the conductor 320 that conforms to and/or fills pin holes 324 in layer 320. In conjunction with the oxide permeation layer 325, a thin metal permeation barrier 330 is provided/deposited (e.g., a layer of aluminum, silver, or the like with a thickness, $t_{Barrier}$, of less than about 5 nm or the like) to create a two layer permeation barrier. A light transmitting conductor 340 may be provided or deposited over the permeation bather 330 of the device 300.

The permeation barrier 330 is useful not only for improving the permeation barrier provided by layer 325 but also for acting to block or inhibit propagation of cracks 335 in the substrate 310 and layer 320 that may be passed through the brittle oxide permeation layer 325. In some cases, self-healing may also cause an oxide plug or block 336 to form at the end of the crack, e.g., if contaminants such as water or oxygen flow through the crack 335 and inorganic oxide permeation barrier 325 (e.g., a thin layer of alumina or the like) to contact permeation bather 330, which is formed, in this case, of a self-healing metal. The configuration of device 300 may be desirable to achieve the very low permeation rates desired for some thin film devices, e.g., about $10^{-6}$ grams/$m^2$-day. For example, an inorganic oxide layer such as alumina or other non-conductive oxide applied by ALD or the like may be used to achieve a permeation rate of about $10^{-5}$ grams/$m^2$-day and such a layer may be used to provide layer 325. The inclusion of a very thin layer (e.g., about 0.5 to about 1 nm) 330 of a conductive metal such as silver, gold, copper, aluminum, or the like as the conformal metal coating may improve the permeation rate (e.g., lower it to or below a desired level such about $10^{-6}$ grams/$m^2$-day or lower). If a self-healing metal is used for layer 330, the layer 330 may block even more permeation pathways such as crack 335, which may further improve the overall barrier permeation of device 300 as may be useful when the device 300 is an organic-based electronics device. The standard or conformal inorganic oxide coating 325 may be deposited via a variety of deposition techniques including physical vapor, chemical vapor, ALD, solution, electrochemistry, and the like.

Figure 4:
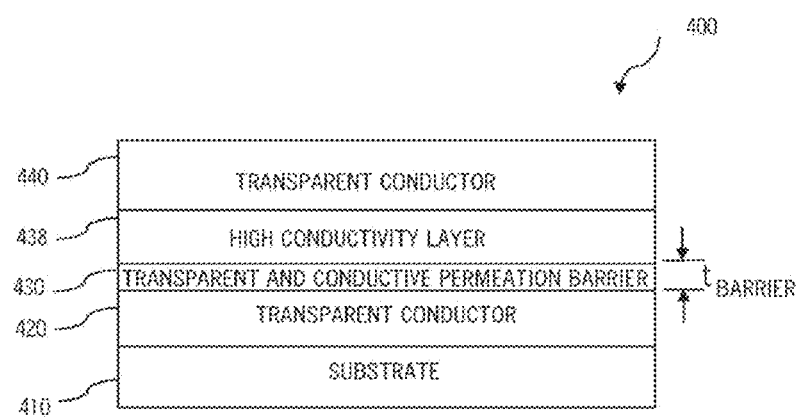
FIG. 4 illustrates schematically a thin film electronic device in which a transparent and conductive permeation barrier is used in conjunction with a high conductivity layer to provide a device with desirable permeation rates along with high transparency and conductivity levels.

FIG. 4 illustrates another thin film electronic device or stack 400 that includes an improved permeation barrier 430. The device 400 includes a light transmitting substrate, and a pair of transparent conductors 420, 440. The device 400 is similar to device 100 of FIG. 1 but is adapted to provide further improved electrical conductivity and fracture toughness. To this end, the device 400 includes an electrically conductive coating 438 such as silver, gold, or other highly conductive metal. A thin film of metal such as aluminum, chromium, or the like (e.g., a metal chosen to provide an enhanced, self-healing barrier) is provided as a transparent and conductive permeation barrier 430.

In other words, the metal chosen for conductivity layer 438 typically has a substantially higher conductivity than the metal chosen for the permeation barrier 430 (which is often chosen for its transmissivity and self-terminating oxide characteristics). The barrier 430 is shown to be interposed between the conductivity layer 438 and conductor 420, but other embodiments of device 400 may position the barrier 430 between the conductivity layer 438 and conductor 440 (or include a second barrier 430 in a differing position). The barrier 430 may be relatively thin with the inclusion of the layer 438 such as with a thickness, $t_{Barrier}$, of less than about 3 nm or even about 0.5 to about 1 nm or the like. In this configuration, permeation barrier characteristics may be better than achieved with use of just the barrier 430 and also the thicknesses of the differing layers 420, 430, 438, 440 can be optimized or selected to achieve particular light transmission and electrical conductivity values/levels for device 400. Furthermore, by incorporating a metal that is inherently ductile in between more brittle layers, the metal layers 430, 438 inhibit cracks from propagating all the way through the coatings 430, 438, which improves electrical conductivity via maintenance of a continuous electrical path and also improves the ability of the coatings 430, 438 to be bent and to withstand cyclic loading without a significant increase in electrical resistance or barrier permeability.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

The invention claimed is:

1. A thin film stack comprising:
   a first electrical conductor layer formed on a material that is at least partially transmissive of light; and
   a thin film comprising a first metal deposited on the first electrical conductor layer, the thin film further comprising a plug, wherein the first electrical conductor layer comprises a permeation pathway that extends from the material to the thin film and the plug is arranged at an interface between the permeation pathway and the thin film.

2. The thin film stack of claim 1, wherein the first metal comprises a non-noble metal.

3. The thin film stack of claim 2, wherein the first metal comprises at least one of aluminum, chromium, or titanium.

4. The thin film stack of claim 1, wherein the thin film has a thickness of less than about 10 nanometers.

5. The thin film stack of claim 4, wherein the thin film thickness is in the range of about 0.5 nanometers to about 3 nanometers.

6. The thin film stack of claim 1, further comprising a second electrical conductor layer that is at least partially transmissive of light, wherein the thin film is interposed between the conductor layers.

7. The thin film stack of claim 6, further comprising a conductivity layer positioned between the first electrical conductor layer and the second electrical conductor layer and abutting the thin film, wherein the conductivity layer is formed of a second metal with an electrical conductivity greater than an electrical conductivity of the thin film.

8. The thin film stack of claim 1, wherein the permeation pathway comprises a crack.

9. The thin film stack of claim 1, wherein the plug comprises a metal oxide.

10. A thin film electronic device comprising:
    a light transmitting substrate;
    a first light transmitting conductor on the light transmitting substrate;
    a second light transmitting conductor above the first conductor; and
    a permeation barrier between the first conductor and the second conductor and in direct contact with at least one of the first conductor or the second conductor, wherein the permeation barrier is at least partially transmissive to light and is an electrical conductor, at least one of the first conductor and the second conductor comprises at least one permeation pathway, and the permeation barrier comprises at least one plug arranged at an interface between the permeation pathway and the permeation barrier.

11. The device of claim 10, wherein the permeation barrier comprises a metal.

12. The device of claim 11, wherein the metal comprises a non-noble metal.

13. The device of claim 12, wherein the metal comprises one of aluminum, chromium, and titanium.

14. The device of claim 10, wherein the thickness of the permeation barrier is less than about 5 nanometers.

15. The device of claim 10, wherein the first conductor and the second conductor comprise a first thin film of at least one transparent conducting oxide (TCO) and a second thin film of at least one TCO respectively.

16. A thin film stack comprising:
    a substrate that is at least partially transmissive to light;
    a first electrical conductor layer positioned above the substrate;
    a second electrical conductor layer positioned above the first conductor layer;
    a first permeation barrier comprising a thin film comprising a metal, wherein the first permeation barrier is positioned between the first conductor layer and the second conductor layer and is in direct contact with at least one of the first conductor layer or the second conductor layer; and
    a second permeation barrier comprising at least one of an organic oxide, an inorganic oxide, or a nitride, wherein the second permeation barrier is in direct contact with the conductor layer that is not in direct contact with the first permeation barrier,
    wherein at least one of the first conductor layer or the second conductor layer comprises a permeation pathway extending through the conductor layer to the first permeation barrier, and
    wherein the first permeation barrier comprises a metal oxide plug positioned at an interface between the permeation pathway and the first permeation barrier.

* * * * *